(12) United States Patent
Zheng et al.

(10) Patent No.: US 12,074,736 B2
(45) Date of Patent: Aug. 27, 2024

(54) RADIO TRANSMITTER AND METHOD THEREFOR

(71) Applicant: Telefonaktiebolaget LM Ericsson (publ), Stockholm (SE)

(72) Inventors: Yunji Zheng, Beijing (CN); Haiying Krishna Cao, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 42 days.

(21) Appl. No.: 18/006,126

(22) PCT Filed: Jul. 20, 2020

(86) PCT No.: PCT/CN2020/103103
§ 371 (c)(1),
(2) Date: Jan. 19, 2023

(87) PCT Pub. No.: WO2022/016336
PCT Pub. Date: Jan. 27, 2022

(65) Prior Publication Data
US 2023/0291619 A1 Sep. 14, 2023

(51) Int. Cl.
*H04L 25/03* (2006.01)
*H04B 1/04* (2006.01)
*H04L 27/36* (2006.01)

(52) U.S. Cl.
CPC ......... *H04L 25/03343* (2013.01); *H04B 1/04* (2013.01); *H04L 27/36* (2013.01); *H04B 2001/0425* (2013.01)

(58) Field of Classification Search
CPC .............. H04B 1/04; H04B 2001/0425; H04L 25/03343; H04L 27/36
(Continued)

(56) References Cited

U.S. PATENT DOCUMENTS

| 2017/0047954 A1 | 2/2017 | Tian et al. |
| 2020/0059256 A1 | 2/2020 | Cao et al. |
| 2022/0376721 A1* | 11/2022 | Nammi ................ H04B 1/0475 |

FOREIGN PATENT DOCUMENTS

| CN | 108833318 A | 11/2018 |
| WO | 2015165087 A1 | 11/2015 |

(Continued)

OTHER PUBLICATIONS

International Search Report and the Written Opinion of the International Searching Authority, issued in corresponding International Application No. PCT/CN2020/103103, dated Apr. 1, 2021, 8 pages.
Abdelaziz et al., "Digital Predistortion for Hybrid MIMO Transmitters", IEEE Journal of Selected Topics in Signal Processing, vol. 12, No. 3, Jun. 30, 2018, pp. 1-11.
(Continued)

*Primary Examiner* — Leila Malek
(74) *Attorney, Agent, or Firm* — Rothwell, Figg, Ernst & Manbeck, P.C.

(57) ABSTRACT

A radio transmitter and a method therefor are disclosed. According to an embodiment, the radio transmitter comprises a first power amplifier (PA) corresponding to a first antenna port, an observation receiver, a first determination module, a first pre-distortion module, one or more second PA each corresponding to a second antenna port, one or more second determination module and one or more second pre-distortion module. The first determination module is configured to determine a first function reflecting a nonlinearity of the first PA, based on a first input signal to the first PA, an observation signal from the observation receiver and a first set of parameters characterizing the first PA. The first pre-distortion module is configured to determine and apply a first pre-distortion to a first baseband signal for the first antenna port. Each second determination module is configured to determine a second function reflecting a nonlinearity of the second PA, based on the first function and a difference between a second set of parameters characterizing the second PA and the first set of parameters. Each second pre-
(Continued)

distortion module is configured to determine a second pre-distortion based on the second function and apply the second pre-distortion to a second baseband signal for the second antenna port.

20 Claims, 4 Drawing Sheets

(58) Field of Classification Search
USPC .......................................................... 375/262
See application file for complete search history.

(56) References Cited

FOREIGN PATENT DOCUMENTS

| WO | 2018224161 A1 | 12/2018 |
|---|---|---|
| WO | 2020087339 A1 | 6/2020 |
| WO | 2020125964 A1 | 6/2020 |

OTHER PUBLICATIONS

Ginzberg et al., "A Full-Duplex Quadrature Balanced RF Front End With Digital Pre-PA Self-Interference Cancellation", IEEE Transaction on Microwave Theory and Techniques, vol. 67, No. 12, Dec. 31, 2019, pp. 1-11.

Boccardi et al., "Five Disruptive Technology Directions for 5G", 5G Wireless Communication Systems: Prospects and Challenges, IEEE Communications Magazine, Feb. 2014, pp. 74-80.

Larsson et al., "Massive MIMO for Next Generation Wireless Systems", Accepted from Open Call, IEEE Communications Magazine, Feb. 2014, pp. 186-195.

Ericsson, "CR to TS 38.104 on Combined updates from RAN4 #90", 3GPP TSG-RAN WG4 Meeting #90, R4-1901686, Athens, Greece, Feb. 25-Mar. 1, 2019, pp. 1-213.

Brihuega, A., et al., "Digital Predistortion for Multiuser Hybrid MIMO at mmWaves", IEEE, arXiv:1903.09394v3 Mar. 16, 2020 (15 pages).

Brihuega, A., et al., "Closed-Loop DPD for Digital MIMO Transmitters Under Antenna Crosstalk", IEEE, 2019 (8 pages).

* cited by examiner

RADIO TRANSMITTER AND METHOD THEREFOR

CROSS REFERENCE TO RELATED APPLICATIONS

This application is a 35 U.S.C. § 371 National Stage of International Patent Application No. PCT/CN2020/103103, filed 2020 Jul. 20.

TECHNICAL FIELD

Embodiments of the disclosure generally relate to wireless communication, and, more particularly, to a radio transmitter and a method therefor.

BACKGROUND

This section introduces aspects that may facilitate better understanding of the present disclosure. Accordingly, the statements of this section are to be read in this light and are not to be understood as admissions about what is in the prior art or what is not in the prior art.

In wireless communication, large-scale antenna system, massive multiple input multiple output (MIMO), is one of the most important technologies that enhance spectral and traffic capacity for the 5th generation (5G). A large number of antennas (16, 32, 64, 128) are integrated in the radio for beamforming and thus capacity can be increased. Since the instantaneous transmission bandwidth becomes hundreds of megahertz in 5G and the consumed energy per bit is to be kept constant or preferably even lowered compared to the 4th generation (4G), power amplifiers (PAs) which are the most power hungry components in the transmitter need to have very high efficiency. When PAs operate in a high efficiency region, they usually exhibit severe nonlinearity. To achieve the target of high efficiency and linearity, digital pre-distortion (DPD) is one of the most effective ways.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved solution for a radio transmitter. In particular, one of the problems to be solved by the disclosure is that the conventional DPD solution cannot work well in a case where there are many antennas for use in or with a radio transmitter.

According to a first aspect of the disclosure, there is provided a radio transmitter. The radio transmitter may comprise a first power amplifier (PA) corresponding to a first antenna port, an observation receiver, a first determination module, a first pre-distortion module, one or more second PA each corresponding to a second antenna port, one or more second determination module and one or more second pre-distortion module. The observation receiver may be configured to process an output from the first PA to feed back an observation signal. The first determination module may be configured to determine a first function reflecting a nonlinearity of the first PA, based on a first input signal to the first PA, the observation signal and a first set of parameters characterizing the first PA. The first pre-distortion module may be configured to determine a first pre-distortion and apply the first pre-distortion to a first baseband signal for the first antenna port. Each of the one or more second determination module may be configured to determine a second function reflecting a nonlinearity of the second PA, based on the first function and a difference between a second set of parameters characterizing the second PA and the first set of parameters. Each of the one or more second pre-distortion module may be configured to determine a second pre-distortion based on the second function and apply the second pre-distortion to a second baseband signal for the second antenna port.

In this way, only one observation branch is needed so that the complexity and cost of the radio transmitter can be reduced to improve total power consumption and radio thermal performance.

In an embodiment of the disclosure, the second function may be determined as a sum of the first function and a product between a first order derivative function of the first function and the difference.

In an embodiment of the disclosure, the second pre-distortion may be determined by using the first pre-distortion as an initial estimate of the second pre-distortion.

In an embodiment of the disclosure, the second pre-distortion may be determined such that an error between a scaled value of the second function corresponding to the second PA and a value of the second baseband signal is minimized.

In an embodiment of the disclosure, the second pre-distortion may be determined by using one of: a least squares (LS) process; a recursive least squares (RLS) process; and a least mean square (LMS) process.

In an embodiment of the disclosure, a set of parameters characterizing a PA may comprise one or more of: temperature of the PA; aging of the PA; a gain of the PA; an input power level of the PA; condition variant(s) of the PA; and initial measured parameter(s).

In an embodiment of the disclosure, the condition variant(s) of the PA may comprise one or more of: a bias of the PA; and transistor parameter variance of the PA.

In an embodiment of the disclosure, the initial measured parameter(s) may comprise one or more of: 3-dB compression point of output power of the PA; and amplitude modulation/phase modulation (AM/PM) conversion at 3-dB compression point of the PA.

According to a second aspect of the disclosure, there is provided a radio unit comprising the radio transmitter according to the above first aspect.

According to a third aspect of the disclosure, there is provided a base station comprising the radio transmitter according to the above first aspect.

According to a fourth aspect of the disclosure, there is provided a method performed by a processing device for use in a radio transmitter. The radio transmitter may comprise a first PA corresponding to a first antenna port, an observation receiver configured to process an output from the first PA to feed back an observation signal, and one or more second PA each corresponding to a second antenna port. The method may comprise determining a first function reflecting a nonlinearity of the first PA, based on a first input signal to the first PA, the observation signal and a first set of parameters characterizing the first PA. The method may further comprise determining a first pre-distortion and applying the first pre-distortion to a first baseband signal for the first antenna port. The method may further comprise determining, for each of the one or more second PA, a second function reflecting a nonlinearity of the second PA, based on the first function and a difference between a second set of parameters characterizing the second PA and the first set of parameters. The method may further comprise determining, for the second PA, a second pre-distortion based on the second function and applying the second pre-distortion to a second baseband signal for the second antenna port.

In an embodiment of the disclosure, the second function may be determined as a sum of the first function and a product between a first order derivative function of the first function and the difference.

In an embodiment of the disclosure, the second pre-distortion may be determined by using the first pre-distortion as an initial estimate of the second pre-distortion.

In an embodiment of the disclosure, the second pre-distortion may be determined such that an error between a scaled value of the second function corresponding to the second PA and a value of the second baseband signal is minimized.

In an embodiment of the disclosure, the second pre-distortion may be determined by using one of: an LS process; an RLS process; and an LMS process.

In an embodiment of the disclosure, a set of parameters characterizing a PA may comprise one or more of: temperature of the PA; aging of the PA; a gain of the PA; an input power level of the PA; condition variant(s) of the PA; and initial measured parameter(s).

In an embodiment of the disclosure, the condition variant(s) of the PA may comprise one or more of: a bias of the PA; and transistor parameter variance of the PA.

In an embodiment of the disclosure, the initial measured parameter(s) may comprise one or more of: 3-dB compression point of output power of the PA; and AM/PM conversion at 3-dB compression point of the PA.

According to a fifth aspect of the disclosure, there is provided a processing device for use in a radio transmitter. The radio transmitter may comprise a first PA corresponding to a first antenna port, an observation receiver configured to process an output from the first PA to feed back an observation signal, and one or more second PA each corresponding to a second antenna port. The processing device may comprise at least one processor and at least one memory. The at least one memory may contain instructions executable by the at least one processor, whereby the processing device may be operative to determine a first function reflecting a nonlinearity of the first PA, based on a first input signal to the first PA, the observation signal and a first set of parameters characterizing the first PA. The processing device may be further operative to determine a first pre-distortion and apply the first pre-distortion to a first baseband signal for the first antenna port. The processing device may be further operative to determine, for each of the one or more second PA, a second function reflecting a nonlinearity of the second PA, based on the first function and a difference between a second set of parameters characterizing the second PA and the first set of parameters. The processing device may be further operative to determine, for the second PA, a second pre-distortion based on the second function and apply the second pre-distortion to a second baseband signal for the second antenna port.

In an embodiment of the disclosure, the processing device may be operative to perform the method according to the above fourth aspect.

According to a sixth aspect of the disclosure, there is provided a computer program product. The computer program product may comprise instructions which when executed by at least one processor, cause the at least one processor to perform the method according to the above fourth aspect.

According to a seventh aspect of the disclosure, there is provided a computer readable storage medium. The computer readable storage medium may comprise instructions which when executed by at least one processor, cause the at least one processor to perform the method according to the above fourth aspect.

BRIEF DESCRIPTION OF THE DRAWINGS

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 1:
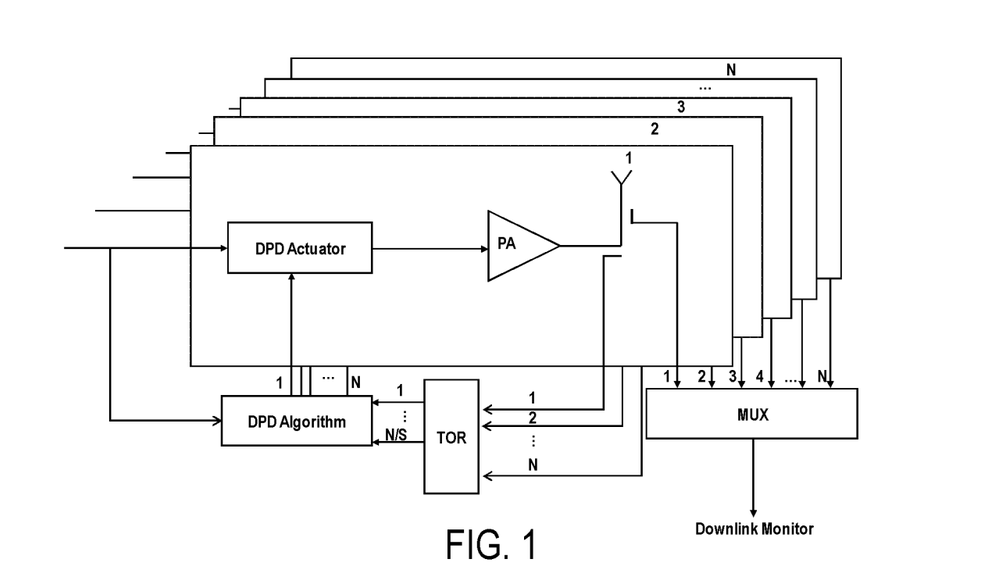
FIG. 1 is a diagram illustrating the DPD solution in a legacy radio product.

As mentioned above, to achieve the target of high efficiency and linearity, DPD is one of the most effective ways. However, DPD algorithms and hardware design on massive MIMO face lots of challenges, in terms of computation complexity, resource utilization, thermal and power consumption. Specifically, most of the designed linearization block in 5G is currently based on legacy radio products (e.g. 2T2R, 4T4R), where "T" refers to transmitter and "R" refers to receiver. FIG. 1 illustrates the DPD solution in a legacy radio product, where N is the number of antenna branches and S indicates how many antenna branches are multiplexed into one feedback branch. As shown, the observation signal is captured by a transmission observation receiver (TOR) from every branch and each branch needs an actuator, so the complexity is increased linearly with the number of branches. It may lead to other problems as well, such as higher power consumption, thermal effects and so forth.

In reality, DPD needs to be adapted, as PA behaviors can change during time due to temperature or bias variations for example and excitation signals can also be changed. If there are many antennas in a radio, using the conventional TOR-sharing solution will make the DPD converge much more slowly. When something, e.g. PA behavior or input signal power changes dramatically, for example, NR signals will have more silent periods and change more rapidly compared to long term evolution (LTE) signals, so the DPD cannot handle this in a very short time and thus radio performance may be affected.

The present disclosure proposes at least an improved radio transmitter and a method therefor. The radio transmitter may be a radio unit (e.g. a remote radio unit (RRU), an active antenna system (AAS), or the like) or a portion thereof. This means the radio transmitter may or may not comprise antennas for transmitting radio signals. The radio unit may be a component of a base station. Thus, the solution of the present disclosure may be applied to a communication system including a terminal device and a base station. The terminal device can communicate through a radio access communication link with the base station. The base station can provide radio access communication links to terminal devices that are within its communication service cell. Note that the communications may be performed between the terminal device and the base station according to any suitable communication standards and protocols.

The term "base station (BS)" may refer to, for example, a node B (NodeB or NB), an evolved Node B (eNodeB or eNB), a next generation Node B (gNodeB or gNB), a relay, a low power node such as a femto, a pico, and so forth. For example, a base station may comprise a central unit (CU) (which may include, e.g. CU user plane (UP) and CU control plane (CP)) and one or more distributed units (DUs). The CU and DU(s) may co-locate in a same network node, e.g. a same base station.

The terminal device may also be referred to as, for example, device, access terminal, user equipment (UE), mobile station, mobile unit, subscriber station, or the like. It may refer to any end device that can access a wireless communication network and receive services therefrom. By way of example and not limitation, the terminal device may include a portable computer, an image capture terminal device such as a digital camera, a gaming terminal device, a music storage and playback appliance, a mobile phone, a cellular phone, a smart phone, a tablet, a wearable device, a personal digital assistant (PDA), or the like.

In an Internet of things (IoT) scenario, a terminal device may represent a machine or other device that performs monitoring and/or measurements, and transmits the results of such monitoring and/or measurements to another terminal device and/or a network equipment. In this case, the terminal device may be a machine-to-machine (M2M) device, which may, in a 3rd generation partnership project (3GPP) context, be referred to as a machine-type communication (MTC) device. Particular examples of such machines or devices may include sensors, metering devices such as power meters, industrial machineries, bikes, vehicles, or home or personal appliances, e.g. refrigerators, televisions, personal wearables such as watches, and so on.

Figure 2:
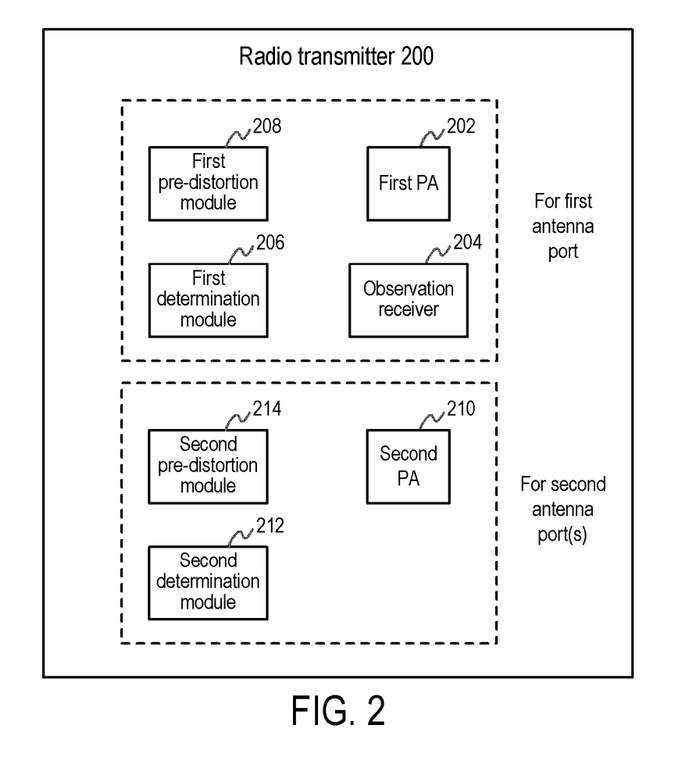
FIG. 2 is a block diagram illustrating a radio transmitter according to an embodiment of the disclosure.

Hereinafter, the solution of the present disclosure will be described in detail with reference to FIGS. 2-6. FIG. 2 is a block diagram illustrating a radio transmitter according to an embodiment of the disclosure. As shown, the radio transmitter 200 comprises a first PA corresponding to a first antenna port, an observation receiver 204, a first determination module 206, a first pre-distortion module 208, one or more second PA 210 each corresponding to a second antenna port, one or more second determination module 212, and one or more second pre-distortion module 214.

The observation receiver 204 may be configured to process an output from the first PA to feed back an observation signal. For example, the observation receiver may also be referred to as a transmission observation receiver (TOR) which down coverts the output from the first PA (a radio frequency (RF) signal) to the observation signal (a baseband or intermediate frequency (IF) signal). As an exemplary example, the observation receiver 204 may include an RF downconverting mixer, an intermediate frequency (IF) amplifier, a bandpass filter and an analog to digital converter (ADC) to generate the feedback in digital domain. Due to the feedback provided by the observation receiver 204, the components 202, 204, 206 and 208 form a closed loop (or branch) for the first antenna port. This branch corresponding to the first antenna port may also be referred to as a reference branch.

The first determination module 206 may be configured to determine a first function reflecting a nonlinearity of the first PA, based on a first input signal to the first PA, the observation signal and a first set of parameters characterizing the first PA. At least part of the first determination module 206 may be implemented by using by a hardware circuit such as an application specific integrated circuit (ASIC), a field programmable gate array (FPGA), a digital signal processor (DSP), or the like. For example, the first input signal may be a first baseband signal for the first antenna port (or corresponding to the first antenna port) if a first pre-distortion (described later) is not applied by the first pre-distortion module to the first baseband signal, or may be a pre-distorted baseband signal if the first pre-distortion is applied by the first pre-distortion module to the first baseband signal.

Figure 3:
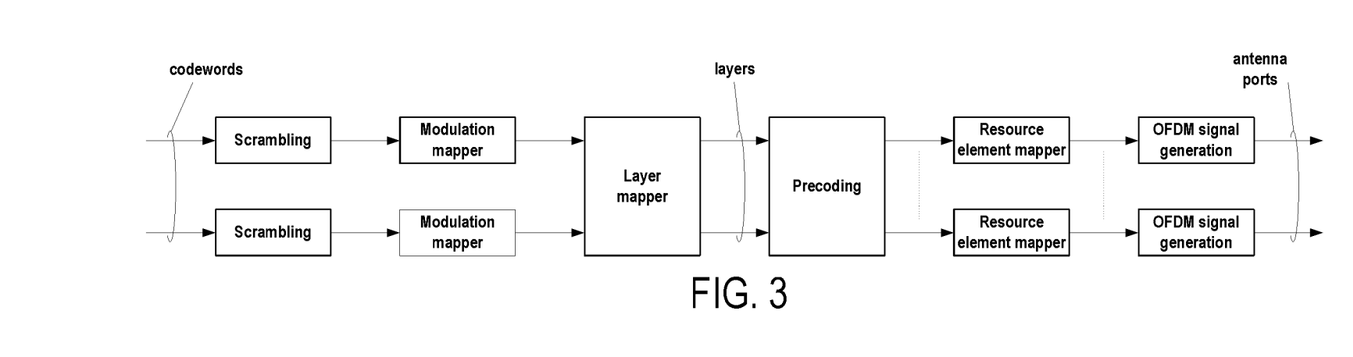
FIG. 3 is a diagram illustrating the existing physical channel processing in 5G.

Suppose the first baseband signal for the first antenna port and one or more second baseband signal for the one or more second antenna port are 5G or new radio (NR) signals generated by using, for example, the physical channel processing shown in FIG. 3. FIG. 3 is FIGS. 6.3-1 of 3rd generation partnership project (3GPP) technical specification (TS) 36.211 V16.1.0. The details of the processing can be obtained from this technical specification, which is incorporated herein by reference in its entirety. Then, in NR downlink, the baseband unit (BBU) sends all layers that are to be transmitted to all users within one symbol. The layers are sent via the C2 interface and resource element (RE) mapping function which maps the received layers to corresponding sub-carriers. The input signal z(n) of a downlink layer can be represented as:

$$z(n)=D(n)_{Li}, \quad (1)$$

where D (n) is the data from the baseband unit and Li is the number of the downlink layer. The weights w on different antenna branches are a function of both amplitude and phase:

$$w=ae^{j\varphi}, \quad (2)$$

where a is the signal amplitude and φ is the phase of different antenna. Thus, the baseband signal x(n) after the layer mapper and precoding can be represented as:

$$x(n)=\Sigma w^*z(n) \quad (3)$$

So each antenna port contains the same signal that only be modulated by digital beamforming weights in time domain. Accordingly, the baseband equivalent signal of the reference branch $x_{ref}(n)$ in time domain can be represented as:

$$x_{ref}(n)=\Sigma_{i=0}^{K-1}w_i^*z_i(n), \quad (4)$$

where i is the index of the antenna ports and K is the total number of antenna ports. Then, $x_{ref}(n)$ is the first baseband signal for the first antenna port mentioned above. Although the 5G/NR signal has been described above, a skilled person in the art can understand that the principle of the present disclosure can also be applied to any other suitable signal.

For example, for a PA (e.g. the first PA or the second PA), the set of parameters characterizing the PA may be used for modeling the PA and comprise one or more of: temperature of the PA; aging of the PA; a gain of the PA; an input power level of the PA; condition variant(s) of the PA; initial measured parameter(s), and the like. Examples of the condition variant(s) of the PA may include, but not limited to, a bias of the PA, transistor parameter variance of the PA, and the like. Examples of the initial measured parameter(s) may include, but not limited to, 3-dB compression point of output power of the PA, amplitude modulation/amplitude modulation (AM/AM) parameters, amplitude modulation/phase modulation (AM/PM) parameters such as AM/PM conversion at 3-dB compression point of the PA, and the like. As an exemplary example, the input parameters for the PA model can be represented as:

$$\theta\{t,a,v,g,pin,\text{init}\}, \tag{5}$$

where t is temperature, a is aging, v is condition variants (e.g. bias, transistor parameter variance), g is gain, pin is the PA's input power level, and init is the PA's initial measured parameters.

Then, the signal $y_{ref}(n)$ that is output from the first PA in the reference branch can be represented as:

$$y_{ref}(n) = p(x_{ref}(n), \theta_{ref}), \tag{6}$$

where $x_{ref}(n)$ has been mentioned above and is the first input signal to the first PA in a case where the first pre-distortion is not applied, $\theta_{ref}$ is the first set of parameters, p(.) is the first function reflecting the nonlinearity of the first PA, and $y_{ref}(n)$ is the radio signal that is output from the first PA. Since the reference branch is a closed loop, which $y_{ref}(n)$ can be indicated by the observation signal. As described above, if the first pre-distortion is not applied, the first input signal $x_{ref}(n)$ can be determined as the first baseband signal. If the first pre-distortion is applied, since the first pre-distortion can be determined by the first pre-distortion model described later, the first input signal $x_{ref}(n)$ can be determined as a product between the first baseband signal and the first pre-distortion. In addition, the values of the first set of parameters $\theta_{ref}$ can be measured and saved in advance (e.g. by a calibration process) before the radio transmitter leaves factory. When the radio transmitter is working, part of the values of the first set of parameters (e.g. t, a, etc.) may change with time. To track such changes, a PA parameter monitoring device (including e.g. sensor, timer, etc.) may be used in the first determination module. With the above known variables $x_{ref}(n)$, $\theta_{ref}$ and $y_{ref}(n)$, the PA model behavior p (.) can be obtained accurately. Note that different values of p(.) may be output according to the input parameter variant of t, a, v, g, pin, init. Also note that various methods for modeling a PA by using measured parameters may be used in the present disclosure. Some examples of such methods may include: but not limited to, H. Statz, et al. "GaAs FET Device and Circuit Simulation in SPICE", IEEE Transactions on Electron Devices, Vol. 34, Issue 2, February 1987; Grob, Siegfried and Juergen Lindner, "Polynomial Model Derivation of Nonlinear Amplifiers", Department of Information Technology, University of Ulm, Germany; Matthias Rudolph, "Nonlinear Transistor Model Parameter Extraction Techniques".

The first pre-distortion module 208 may be configured to determine a first pre-distortion and apply the first pre-distortion to the first baseband signal for the first antenna port. At least part of the first pre-distortion module 208 may be implemented by using by a hardware circuit such as an ASIC, a FPGA, a DSP, or the like. As an example, the first pre-distortion may be represented by first DPD coefficients and determined by using an LMS process. In the LMS process, the first DPD coefficient $C_{ref}(n+1)$ in the next iteration can be represented as:

$$C_{ref}(n+1) = C_{ref}(n) + \mu * \varepsilon_{ref}(n) * x_{ref}(n), \tag{7}$$

$$\varepsilon_{ref}(n) = \frac{1}{\alpha_{ref}} * y_{ref}(n) - x_{ref}(n), \tag{8}$$

where $C_{ref}(n)$ is the first DPD coefficient in the current iteration, μ is a convergence coefficient, $\varepsilon_{ref}(n)$ is the error for the reference branch, and $\alpha_{ref}$ is the gain for the reference branch. However, the present disclosure is not limited to this example. As another example, various other processes, such as an LS process, an RLS process and the like, may be used instead for determining the first pre-distortion.

Each of the one or more second determination module 212 may be configured to determine a second function reflecting a nonlinearity of the second PA, based on the first function and a difference between a second set of parameters characterizing the second PA and the first set of parameters. At least part of the second determination module 212 may be implemented by using by a hardware circuit such as an ASIC, a FPGA, a DSP, or the like. Suppose there are N antenna branches in the radio transmitter. The reference branch (corresponding to the first PA) is branch N−1 and the other branches (corresponding to the second PAs) are branch i=0,1,2, . . . , N−2. Then, according to Taylor expansion, the second output signal from the second PA can be represented as:

$$y_i(n) \approx p(x_i(n), \theta_{ref}) + p'(x_i(n), \theta_{ref}) * \theta_{\Delta i}, \tag{9}$$

$$\theta_{\Delta i} = \theta_i - \theta_{ref}, \tag{10}$$

where $x_i$ (n) is the second input signal to the second PA, $y_i$ (n) is the model output (corresponding to the second function), $\theta_i$ is the second set of parameters and p' is the derivative of function p. Thus, the second function may be determined as a sum of the first function and a product between a first order derivative function of the first function and the difference. Since the second function can be determined based on the first function, no observation receiver(s) are needed for the second PA(s) such that complexity and cost of the radio transmitter can be reduced to improve total power consumption and radio thermal performance. Note that the second function may take other forms (e.g. containing additional items using higher order derivative function of the first function) according to Taylor expansion.

Similar to the first set of parameters, the values of the second set of parameters $\theta_i$ can be measured and saved in advance (e.g. by a calibration process) before the radio transmitter leaves factory. When the radio transmitter is working, part of the values of the second set of parameters (e.g. t, a, etc.) may change with time. To track such changes, a PA parameter monitoring device (including e.g. sensor, timer, etc.) may be used in the second determination module. Alternatively, one PA parameter monitoring device may be shared by the first and second determination module.

Each of the one or more second pre-distortion module 214 may be configured to determine a second pre-distortion based on the second function and apply the second pre-distortion to a second baseband signal for the second antenna port. At least part of the second pre-distortion module 214 may be implemented by using by a hardware circuit such as an ASIC, a FPGA, a DSP, or the like. As an example, the second pre-distortion may be represented by second DPD coefficients and determined by using an LMS process. In the LMS process, the second DPD coefficient $C_i$ (n+1) in the next iteration can be represented as:

$$C_i(n+1) = C_i(n) + \mu * \varepsilon_i(n) * x_i(n), \quad (11)$$

$$\varepsilon_i(n) = \frac{1}{\alpha_i} * y_i(n) - x_i(n), \quad (12)$$

$$y_i(n) = p\big(C_i^T(n) * x_i(n), \theta_i(n)\big), \quad (13)$$

where $C_i(n)$ is the second DPD coefficient in the current iteration, $\varepsilon_i(n)$ is the error for branch i, $\alpha_i$ is the gain for branch i, and $\theta_i(n)$ is the second set of parameters in the current iteration. Optionally, the first DPD coefficient $C_{ref}^T(n)$ for the reference branch may be selected as the initial estimate of the second DPD coefficient $C_i^T(n)$ in the initial iteration. As a result, the convergence speed for determining the second pre-distortion can be increased. In this sense, such determination of DPD coefficients may also be referred to as delta DPD coefficient determination. Note that various other processes, such as an LS process, an RLS process and the like, may be used instead for determining the second pre-distortion as long as the error between a scaled value of the second function corresponding to the second PA and a value of the second baseband signal is minimized.

Correspondingly, an aspect of the present disclosure provides a radio unit (e.g. an RRU, an AAS, etc.) comprising the radio transmitter described above. Furthermore, another aspect of the present disclosure provides a base station comprising the radio transmitter described above. The other configuration of the radio unit/base station may be well known to a skilled person in the art and its details are omitted here.

Figure 4:
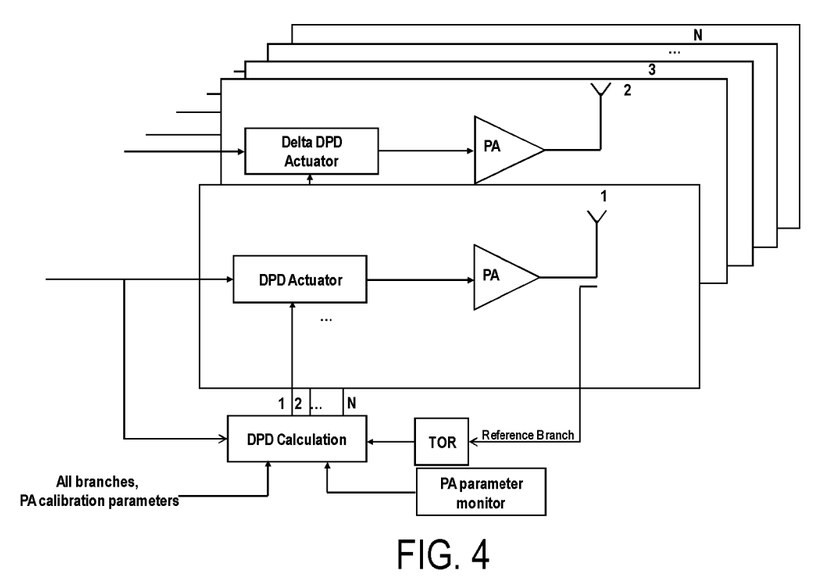
FIG. 4 is a diagram illustrating an exemplary radio transmitter according to an embodiment.

FIG. 4 is a diagram illustrating an exemplary radio transmitter according to an embodiment. In this embodiment, there are N antenna ports corresponding to N antennas. The radio transmitter is provided with a PA parameter monitor (including e.g. sensor, timer, etc.) for tracking changes of the PA parameters. All of the PAs' initial calibration parameters may be stored in a database. The DPD coefficients for the other branches may be adjusted according to the PA model's changing and may be updated to the corresponding delta DPD actuators. The DPD actuator for the reference branch and the delta DPD actuator for the other branches may be implemented as a multiplier.

Thus, in this embodiment, the first determination module described above may be partly implemented as the PA parameter monitor and the database, and partly implemented in the DPD calculation module. The first pre-distortion module described above may be partly implemented in the DPD calculation module and partly implemented as the DPD actuator. The second determination modules described above may be partly implemented as the PA parameter monitor and the database, and partly implemented in the DPD calculation module. The second pre-distortion modules described above may be partly implemented in the DPD calculation module and partly implemented as the delta DPD actuators.

Figure 5:
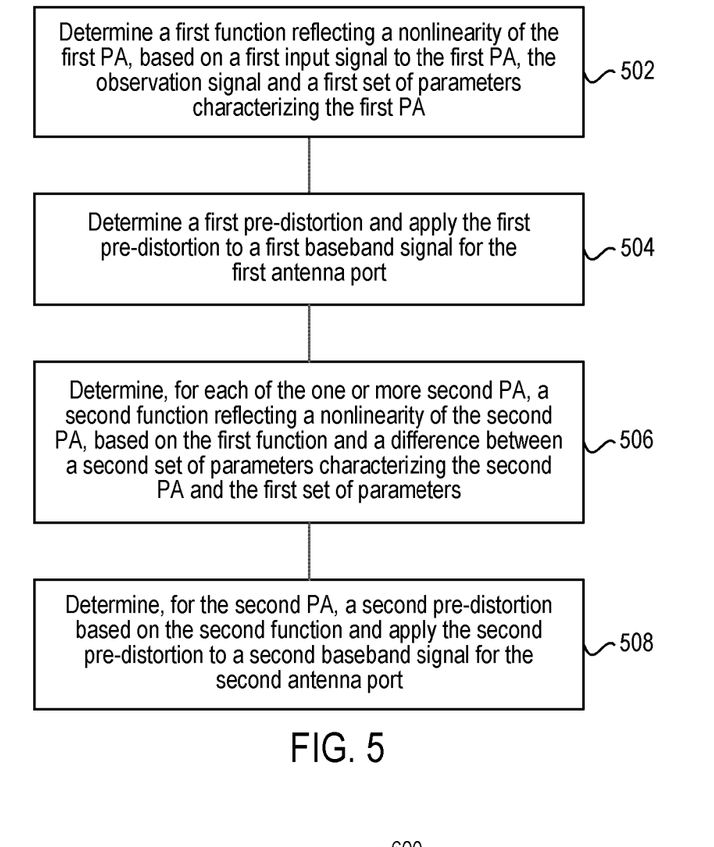
FIG. 5 is a flowchart illustrating a method performed by a processing device according to an embodiment of the disclosure.

FIG. 5 is a flowchart illustrating a method performed by a processing device according to an embodiment of the disclosure. The processing device may be used in a radio transmitter which comprises a first PA corresponding to a first antenna port, an observation receiver configured to process an output from the first PA to feed back an observation signal, and one or more second PA each corresponding to a second antenna port. At block 502, a first function reflecting a nonlinearity of the first PA is determined based on a first input signal to the first PA, the observation signal and a first set of parameters characterizing the first PA. At block 504, a first pre-distortion is determined and applied to a first baseband signal for the first antenna port. At block 506, for each of the one or more second PA, a second function reflecting a nonlinearity of the second PA is determined based on the first function and a difference between a second set of parameters characterizing the second PA and the first set of parameters. At block 508, for the second PA, a second pre-distortion is determined based on the second function and applied to a second baseband signal for the second antenna port. The details of the above blocks have been described with respect to the radio transmitter of FIG. 2 and thus are omitted here.

Figure 6:
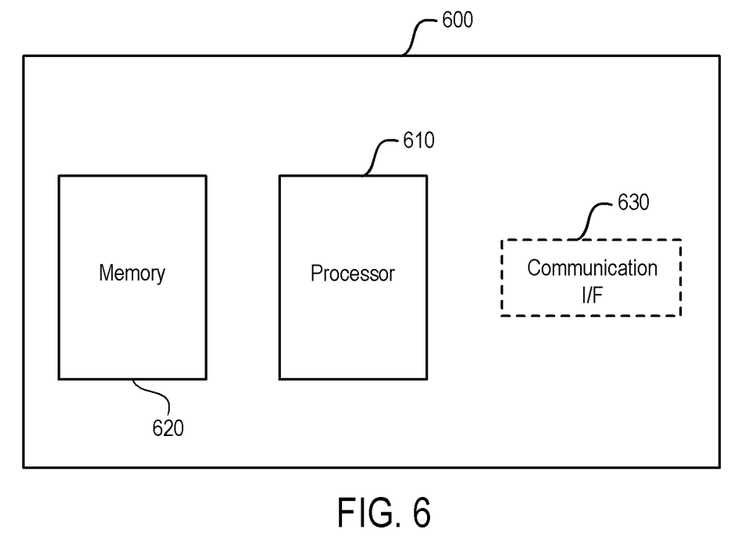
FIG. 6 is a block diagram showing an apparatus suitable for use in practicing some embodiments of the disclosure.

FIG. 6 is a block diagram showing an apparatus suitable for use in practicing some embodiments of the disclosure. For example, the processing device described above may be implemented through the apparatus 600. As shown, the apparatus 600 may include a processor 610, a memory 620 that stores a program, and optionally a communication interface 630 for communicating data with other external devices through wired and/or wireless communication.

The program includes program instructions that, when executed by the processor 610, enable the apparatus 600 to operate in accordance with the embodiments of the present disclosure, as discussed above. That is, the embodiments of the present disclosure may be implemented at least in part by computer software executable by the processor 610, or by hardware, or by a combination of software and hardware.

The memory 620 may be of any type suitable to the local technical environment and may be implemented using any suitable data storage technology, such as semiconductor based memory devices, flash memories, magnetic memory devices and systems, optical memory devices and systems, fixed memories and removable memories. The processor 610 may be of any type suitable to the local technical environment, and may include one or more of general purpose computers, special purpose computers, microprocessors, digital signal processors (DSPs) and processors based on multi-core processor architectures, as non-limiting examples.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one skilled in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A radio transmitter comprising:
    a first power amplifier (PA) corresponding to a first antenna port;
    an observation receiver configured to process an output from the first PA to feed back an observation signal;
    a first determination module configured to determine a first function reflecting a nonlinearity of the first PA, based on a first input signal to the first PA, the observation signal and a first set of parameters characterizing the first PA;
    a first pre-distortion module configured to determine a first pre-distortion and apply the first pre-distortion to a first baseband signal for the first antenna port;
    one or more second PA each corresponding to a second antenna port;
    one or more second determination module each configured to determine a second function reflecting a nonlinearity of the second PA, based on the first function and a difference between a second set of parameters characterizing the second PA and the first set of parameters; and
    one or more second pre-distortion module each configured to determine a second pre-distortion based on the second function and apply the second pre-distortion to a second baseband signal for the second antenna port.

2. The radio transmitter of claim 1, wherein the second function is determined as a sum of the first function and a product between a first order derivative function of the first function and the difference.

3. The radio transmitter of claim 1, wherein the second pre-distortion is determined by using the first pre-distortion as an initial estimate of the second pre-distortion.

4. The radio transmitter of claim 1, wherein the second pre-distortion is determined such that an error between a scaled value of the second function corresponding to the second PA and a value of the second baseband signal is minimized.

5. The radio transmitter of claim 4, wherein the second pre-distortion is determined by using one of:
    a least squares process; a recursive least squares process; or a least mean square process.

6. The radio transmitter of claim 1, wherein a set of parameters characterizing a PA comprises:
    temperature of the PA;
    aging of the PA;
    a gain of the PA;
    an input power level of the PA;
    condition variant(s) of the PA; and/or
    initial measured parameter(s).

7. The radio transmitter of claim 6, wherein the condition variant(s) of the PA comprise:
    a bias of the PA; and/or
    transistor parameter variance of the PA.

8. The radio transmitter of claim 6, wherein the initial measured parameter(s) comprise:
    3-dB compression point of output power of the PA; and/or
    amplitude modulation/phase modulation, AM/PM, conversion at 3-dB compression point of the PA.

9. A radio unit comprising the radio transmitter of claim 1.

10. A base station comprising the radio transmitter of claim 1.

11. A method performed by a processing device for use in a radio transmitter, wherein the radio transmitter comprises a first power amplifier (PA) corresponding to a first antenna port, an observation receiver configured to process an output from the first PA to feed back an observation signal, and one or more second PA each corresponding to a second antenna port, the method comprising:

determining a first function reflecting a nonlinearity of the first PA, based on a first input signal to the first PA, the observation signal and a first set of parameters characterizing the first PA;

determining a first pre-distortion and applying the first pre-distortion to a first baseband signal for the first antenna port;

determining, for each of the one or more second PA, a second function reflecting a nonlinearity of the second PA, based on the first function and a difference between a second set of parameters characterizing the second PA and the first set of parameters; and determining, for the second PA, a second pre-distortion based on the second function and applying the second pre-distortion to a second baseband signal for the second antenna port.

12. The method of claim 11, wherein the second function is determined as a sum of the first function and a product between a first order derivative function of the first function and the difference.

13. The method of claim 11, wherein the second pre-distortion is determined by using the first pre-distortion as an initial estimate of the second pre-distortion.

14. The method of claim 11, wherein the second pre-distortion is determined such that an error between a scaled value of the second function corresponding to the second PA and a value of the second baseband signal is minimized.

15. The method of claim 14, wherein the second pre-distortion is determined by using one of:
a least squares process; a recursive least squares process; or a least mean square, process.

16. The method of claim 11, wherein a set of parameters characterizing a PA comprise:
temperature of the PA;
aging of the PA;
a gain of the PA;
an input power level of the PA;
condition variant(s) of the PA; and/or
initial measured parameter(s).

17. The method of claim 16, wherein the condition variant(s) of the PA comprise:

a bias of the PA; and/or
transistor parameter variance of the PA.

18. The method of claim 16, wherein the initial measured parameter(s) comprise:
3-dB compression point of output power of the PA; and/or
amplitude modulation/phase modulation conversion at 3-dB compression point of the PA.

19. A processing device for use in a radio transmitter, wherein the radio transmitter comprises a first power amplifier (PA) corresponding to a first antenna port, an observation receiver configured to process an output from the first PA to feed back an observation signal, and one or more second PA each corresponding to a second antenna port, the processing device comprising:
at least one processor; and
at least one memory, the at least one memory containing instructions executable by the at least one processor, whereby the processing device is operative to:
determine a first function reflecting a nonlinearity of the first PA, based on a first input signal to the first PA, the observation signal and a first set of parameters characterizing the first PA;
determine a first pre-distortion and apply the first pre-distortion to a first baseband signal for the first antenna port;
determine, for each of the one or more second PA, a second function reflecting a nonlinearity of the second PA, based on the first function and a difference between a second set of parameters characterizing the second PA and the first set of parameters; and
determine, for the second PA, a second pre-distortion based on the second function and apply the second pre-distortion to a second baseband signal for the second antenna port.

20. A non-transitory computer readable storage medium comprising instructions which when executed by processing circuitry of a processing device causes the processing device to perform the method of claim 11.

* * * * *